United States Patent [19]

Kitagawa

[11] Patent Number: 4,575,060

[45] Date of Patent: Mar. 11, 1986

[54] FIXING APPLIANCE

[75] Inventor: Hiroji Kitagawa, Nagoya, Japan

[73] Assignee: Kitagawa Industries Co., Ltd., Nagoya, Japan

[21] Appl. No.: 631,313

[22] Filed: Jul. 16, 1984

[30] Foreign Application Priority Data

Jul. 19, 1983 [JP] Japan .......................... 58-112024[U]

[51] Int. Cl.$^4$ ............................................ H01R 13/54
[52] U.S. Cl. .................... 269/43; 269/48.1; 269/903; 29/281.1
[58] Field of Search ............... 248/68.1, 69, 73, 74.2; 339/17 LM, 17 M, 17 N, 4; 324/73 PC; 269/47, 48.1, 43, 55, 254 R, 903; 29/281.1, 281.4, 281.5

[56] References Cited

U.S. PATENT DOCUMENTS

| | | | |
|---|---|---|---|
| 3,441,986 | 5/1969 | Pritchard | 248/68.1 |
| 3,599,915 | 8/1971 | Soltysik | 248/68.1 |
| 3,894,706 | 7/1975 | Mizusawa | 248/68.1 |

FOREIGN PATENT DOCUMENTS 1021496  3/1966  United Kingdom ............... 248/74.2

*Primary Examiner*—Robert C. Watson
*Attorney, Agent, or Firm*—Oblon, Fisher, Spivak, McClelland & Maier

[57] ABSTRACT

A fixing appliance according to the present invention is for connecting and holding two substrates in parallel with and at a predetermined distance from a stationary member, one end faces of the substrates being close to each other in a direction along the substrate surfaces, the fixing appliance including two fixing mechanisms for mounting the two substrates, a body portion for holding the substrates at a predetermined spacing from the stationary member, and an elastic pressing portion disposed between the two fixing mechanisms for elastically pressing the end faces of the substrates in directions going away from each other. Therefore, when vibrations are applied to the substrates in directions along the substrate surfaces, the substrates are cushioned from shock and the occurrence of creak can be prevented. Further, the substrates can be easily mounted through the fixing mechanisms.

10 Claims, 13 Drawing Figures

FIXING APPLIANCE

BACKGROUND OF THE INVENTION (1) Field of Art

The present invention relates to a fixing appliance for connecting end portions of two substrates for electronic devices and holding the substrates at a predetermined spacing from a stationary member such as a chassis or the like. Particularly, it is concerned with a fixing appliance having an elastic pressing portion for pressing end faces of substrates in directions going away from each other.

(2) Prior Art

Heretofore, in holding two substrates with respect to a stationary member such as a chassis or the like, there has usually been adopted such means as shown in FIG. 1, in which two fixing means 2, each having fixing mechanisms at both end portions thereof are attached to a chassis 4 at one end portions thereof and in a mutually adjacent state, and substrates 6 and 8 are fixed at one end portions thereof to the other end portions of the fixing means 2. The other end portions of the substrates 6 and 8 are also fixed by the fixing means 2 or other suitable means.

However, such fixing means involve problems, for example, vibrations result in collision between end faces of the substrates 6 and 8 and the resultant shock causes a trouble or generates a creak. This tendency is marked particularly in the cases of substrates used in electronic devices which are loaded or mounted on automobiles or other transportation means. In an effort to solve such problems, there has been proposed such means as shown in FIG. 2, in which end portions of the substrates 6 and 8 are connected by tightening screws 11 through a connector plate 10. But, this means still involves problems such as a troublesome operation for mounting the substrates 6 and 8 and a poor working efficiency.

SUMMARY OF THE INVENTION

The present invention has been accomplished in view of the above-mentioned drawbacks, and it is the object thereof to provide a fixing appliance which can connect two substrates at end portions of the substrates and can serve as a cushion against shock between the substrates even during vibration and which permits an easy mounting of substrates.

The gist of the present invention which has been effected for attaining the above-mentioned object resides in a fixing appliance for connecting two substrates which are parallel to a stationary member and which are close to each other at end faces thereof in a direction along the surfaces of the substrates, and for holding the substrates at a predetermined distance from the stationary member, the fixing appliance including two fixing mechanisms capable of mounting the two substrates, a body portion for holding the substrates at a predetermined spacing from the stationary member, and an elastic pressing portion disposed between the two fixing mechanisms for elastically pressing the end faces of the substrates in directions going away from each other.

Thus, according to the present invention, the elastic pressing portion for pressing the substrate end faces in directions away from each other is provided between the two substrate fixing mechanisms, so even if vibrations are applied to the connection, the resultant shock between the substrates is cushioned and the occurrence of creak can be prevented. Further, since the mounting of the substrates can be effected by the fixing mechanisms, the substrate mounting operation is easy and the substrates can be interconnected even after completion of wiring therebetween.

DESCRIPTION OF PREFERRED EMBODIMENTS

Embodiments of the present invention will be described in detail hereinunder with reference to the drawings which are on a larger scale.

Figure 3:
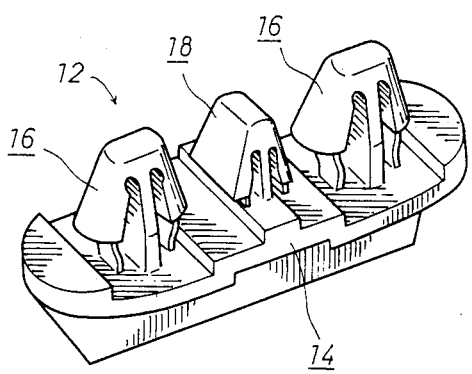
FIG. 3 is an enlarged perspective view of an embodiment of the present invention.

Referring to FIG. 3, there is illustrated a fixing appliance 12, which includes a body portion 14, two substrate mounting portions 16 provided on the body portion 14 and serving as fixing mechanisms, and an elastic pressing portion 18 provided between the substrate mounting portions 16.

Figure 4:
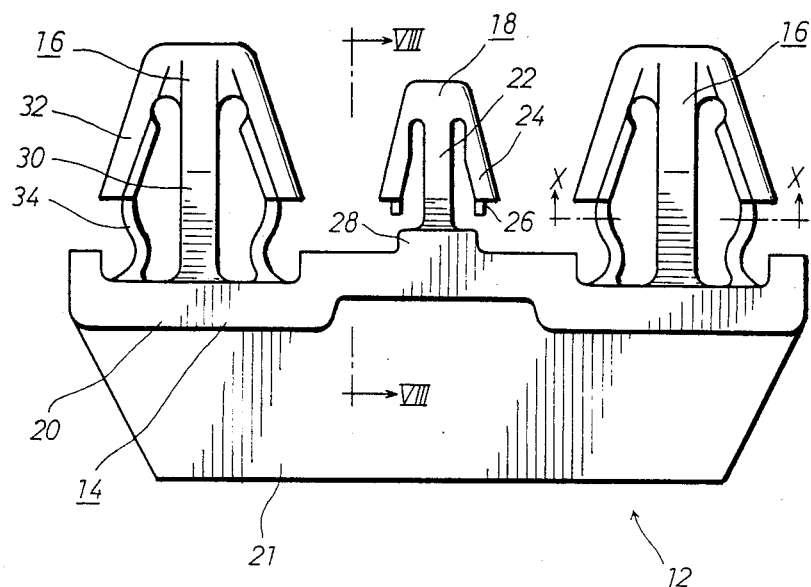
FIG. 4 is a front view thereof.
Figure 5:
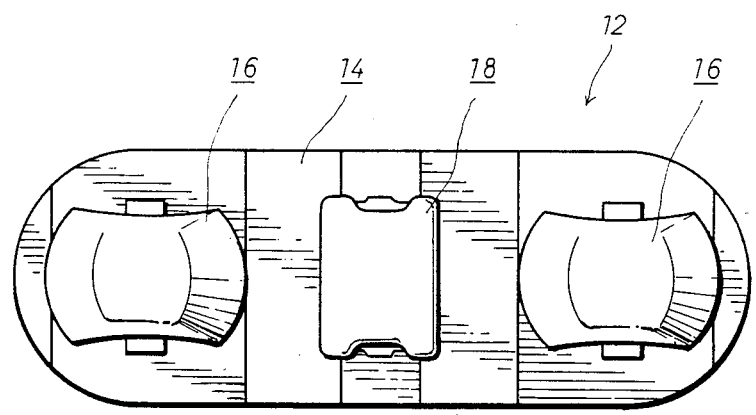
FIG. 5 is a plan view thereof.
Figure 6:
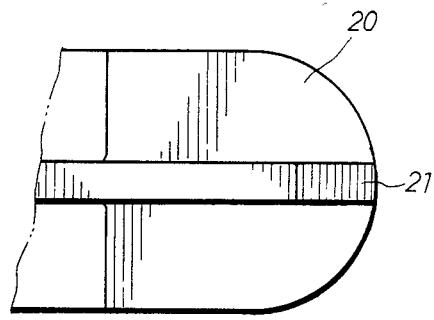
FIG. 6 is a partial bottom view thereof.
Figure 9:
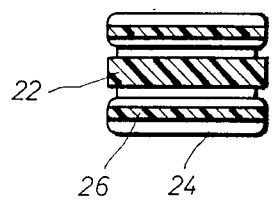
FIG. 9 is a sectional view taken on line IX—IX of FIG. 8.
Figure 8:
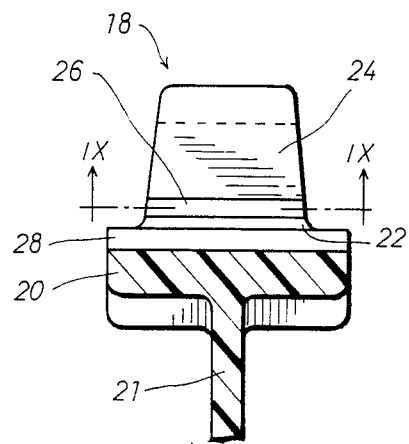
FIG. 8 is a sectional view taken on line VIII—VIII of FIG. 4.

The body portion 14 comprises a plate portion 20 having unevenness and a rib 21 formed on the lower surface of the plate portion 20, as shown in FIGS. 4 through 6. On the upper surface of the plate portion 20 are provided the two substrate mounting portions 16 and the elastic pressing portion 18 disposed therebetween. The elastic pressing portion, as shown also in FIGS. 8 and 9, comprises a support part 22 of a predetermined certain width erected on the plate portion 20, a pair of elastic hook pieces 24 contiguous to the fore end of the support part 22 and capable of expanding sideways by virtue of elasticity, and retaining projections 26 projecting from open side end faces of the elastic hook pieces 24. Consequently, the substrates once mounted by the substrate mounting portions 16 are normally urged at end faces thereof in directions going away from each other by side portions of the retaining projections 26, whereby the vibration, shock and creak of each substrate can be prevented. At the base end of the support part 22 is formed a protrusion of a predetermined certain width, which serves as a positioning portion for the substrate end faces.

Figure 7:
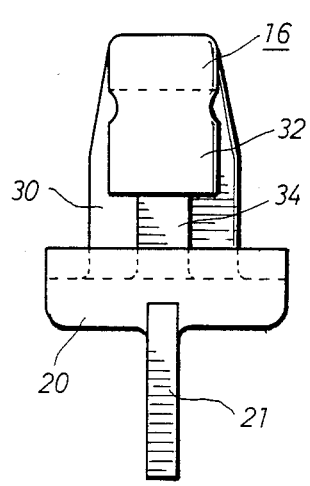
FIG. 7 is a side view thereof.
Figure 10:
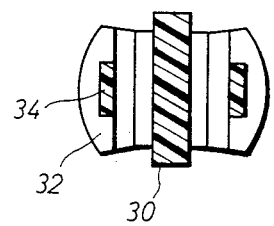
FIG. 10 is a sectional view taken on line X—X of FIG. 4.

On the other hand, the substrate mounting portions 16, as shown in FIGS. 4, 7 and 10, are each comprised of a support part 30 having a predetermined certain width, a pair of elastic hook pieces 32 capable of expanding sideways by virtue of elasticity, and flexible connection pieces 34 integrally formed between lower end faces of the elastic hook pieces 32 and the plate portion 20.

Figure 1:
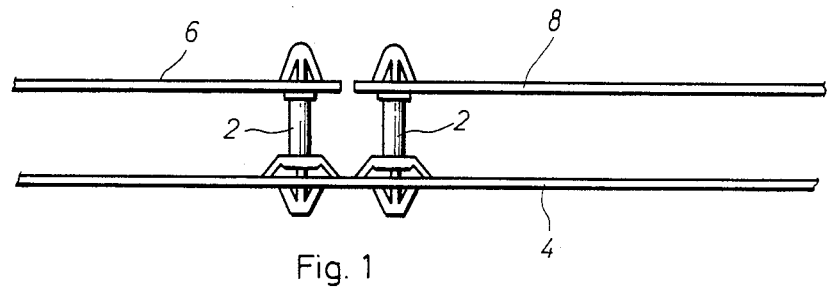
FIGS. 1 and 2 are front views showing conventional examples in which two substrates adjacent to each other are mounted to a chassis.
Figure 2:
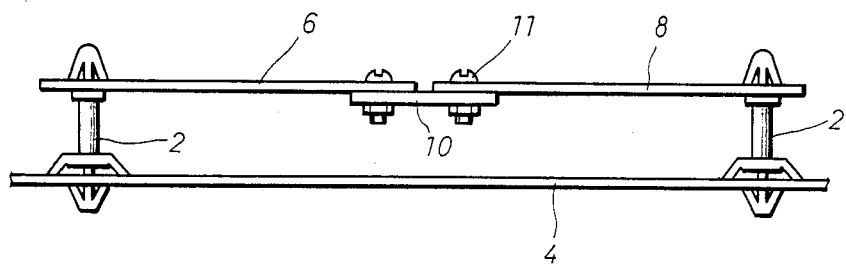
Figure 11:
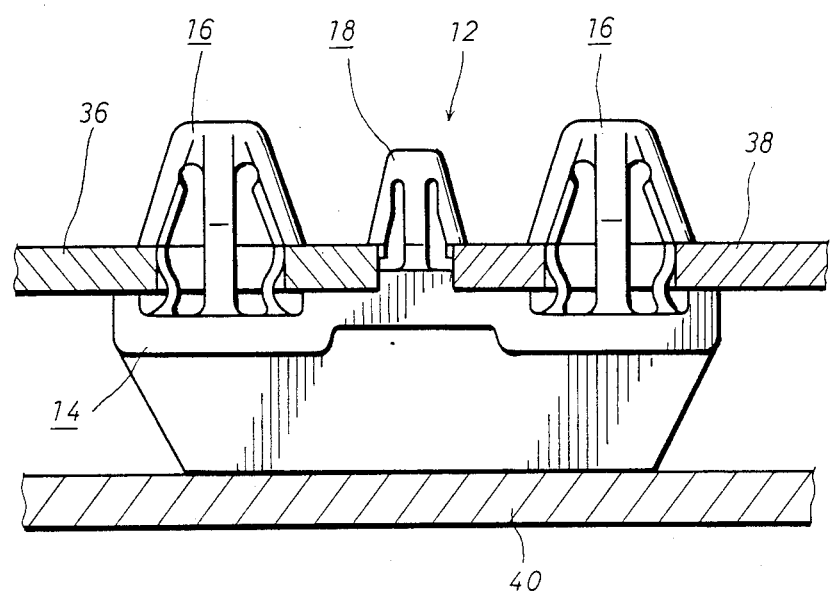
FIG. 11 is a front view, partly in section, showing a state of use of the above embodiment.

In the fixing appliance 12 constructed as above, once the substrate mounting portions 16 are fitted in fixing holes of substrates 36 and 38, as shown in FIG. 11, the elastic hook pieces 32 expand and hook the portions around the fixing holes at the respective lower end faces, and the connection pieces 34 expand within the fixing holes, thereby restricting lateral movements of the substrates 36 and 38, so that the substrates 36 and 38 are interconnected. Besides, the substrates are sideways positioned by abutment of the respective end faces with both sides faces of the protrusion 28 as previously noted. Further, the occurrence of vibration, shock and creak of the substrates is prevented by the pressing action of the elastic pressing portion 18. The substrates 36 and 38 are held at a predetermined distance from a chassis 40 by the body portion 14. Removal of the substrates 36 and 38 can be done easily by operations reverse to the foregoing operations. Therefore, the substrates can be mounted and removed even after completion of wiring for connection between both substrates, and thus the mounting, repair and inspection of the substrates can be done easily. The other end portions of the substrates 36 and 38 are supported, for example, by such fixing means 2 as shown in FIG. 1.

Figure 12:
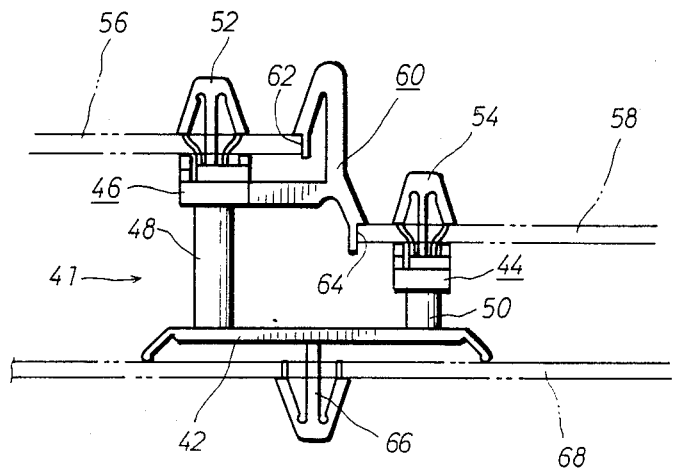
FIGS. 12 and 13 are front views illustrating two other embodiments of the present invention.

Referring now to FIG. 12, there is shown a fixing appliance 41 according to another embodiment of the present invention, in which two substrate mounting portions 44 and 46 of different heights are erected on a plate-like body portion 42. The substrate mounting portions 44 and 46 include a pair of elastic pressing pieces formed on each of bases which are formed at the fore end portions of support rods 48 and 50, and substrate mounting mechanisms 52 and 54 of a structure similar to that of the substrate mounting portion 16 in the foregoing embodiment are each mounted contiguously between the paired elastic pressing pieces, thereby permitting the mounting of substrates 56 and 58. Further, an elastic pressing portion 60 is disposed contiguously to a support arm which in projecting sideways of the substrate mounting portion 46. In the elastic pressing portion 60, an upwardly extending elastic member is bent downward at an intermediate portion thereof and a substrate retaining portion 62 is formed at its fore end. Likewise, a downwardly extending elastic member is formed with a substrate retaining portion 64. On the lower surface of the body portion 42 is disposed a chassis mounting mechanism 66 of a structure similar to that of the substrate mounting mechanisms 52 and 54, which mechanism 66 is mounted to a chassis 68. To the substrate mounting mechanisms 52 and 54 are mounted and connected the substrates 56 and 58, respectively, as shown in FIG. 12.

Figure 13:
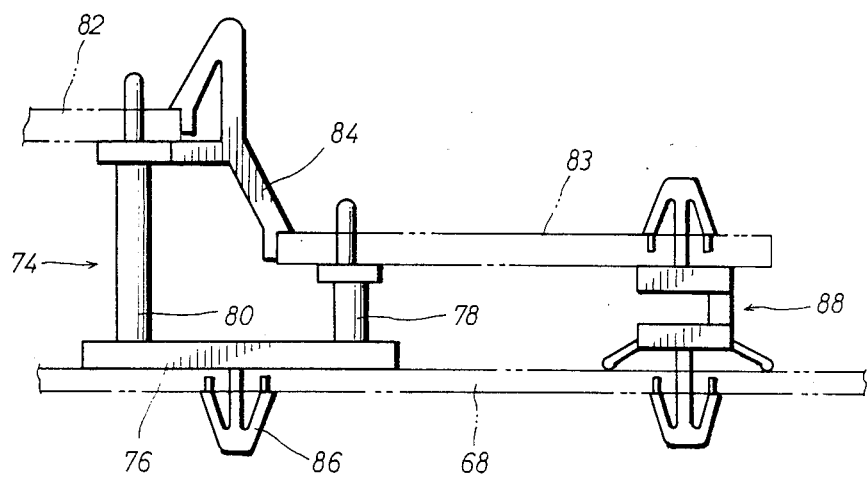

Referring now to FIG. 13, there is illustrated a fixing appliance 74 according to a further embodiment of the present invention, in which support rods 78 and 80 are erected on a body portion 76 and cylindrical retaining projections capable of being fitted in fixing holes of substrates 82 and 83 are formed at the fore end portions of the support rods 78 and 80, and substrates 82 and 83 are mounted by an elastic pressing portion 84 which is of the same structure as the foregoing elastic pressing portion 60. The fixing appliance 74 is mounted to the chassis 68 by means of a chassis mounting mechanism 86. The other end portion of the substrate 83 is held in place by a fixing means 88.

As the substrate mounting portions serving as fixing mechanisms in the embodiments described hereinabove, there may be adopted substrate mounting mechanisms of the type commonly employed. This is also the case with the chassis mounting mechanisms 66 and 86 shown in FIGS. 12 and 13.

The present invention has been described above with respect to several embodiments thereof, but it is to be understood that the invention is not limited thereto and that various modifications may be made within the scope not departing the gist of the present invention.

According to the present invention, as set forth above, an elastic pressing portion is disposed between two substrate fixing mechanisms to press substrate end faces in directions going away from each other, so even when the substrates undergo vibrations in directions along the substrate surfaces, the substrates are cushioned from shock and the occurrence of creak can be prevented. Further, since the fixing mechanisms, substrates can be easily mounted and connected even after completion of wiring therebetween.

What is claimed is:

1. A fixing appliance for connecting and holding two substantially parallel substrates at a predetermined distance from a stationary member, end faces of said two substrates being close to each other in a direction along the substrate surfaces, said fixing appliance including two substrate mounting means for mounting to said two substrates, a body portion for holding said substrates at a predetermined spacing from said stationary member, and an elastic pressing portion disposed between said two substrate mounting means for elastically pressing said end faces of the substrates in directions away from each other, wherein said elastic pressing portion comprises:
    a support part of a predetermined width provided on a protrusion centered on said plate portion, said plate portion having recesses adjacent said protrusion;
    a pair of elastic hook pieces capable of expanding laterally by virtue of the elasticity thereof, said elastic hook pieces extending from a free end of said support part; and
    retaining projections projecting from free end faces of each of said elastic hook pieces.

2. A fixing appliance as set forth in claim 1, wherein a protrusion of a predetermined width is formed at the base end of said support part.

3. A fixing appliance for connecting and holding two substantially parallel substrates at a predetermined distance from a fixing member, end faces of said two substrates being close to each other in a direction along the substrate surfaces, comprising:
    (a) two substrate mounting means for mounting to said two substrates;
    (b) a body portion for holding said two substrates at a predetermined distance from the fixing member, said body portion including a plate portion from which said mounting means extend, said plate portion having unevenness, and a rib formed on a lower surface of said plate portion; and
    (c) an elastic pressing portion disposed between said two substrate mounting means, said elastic pressing portion elastically pressing said end faces of said substrates in directions away from each other.

4. A fixing appliance as set forth in claim 3 wherein said substrate mounting means comprise a support part of a predetermined width, a pair of elastic hook pieces extending from a free end of said support part and capable of expanding laterally by virtue of the elasticity thereof, and flexible connection pieces formed integrally between lower end faces of said elastic hook pieces and said plate portion.

5. A fixing appliance for connecting and holding two substantially parallel substrates at a predetermined distance from a stationary member, end faces of said two substrates being close to each other in a direction along the substrate surfaces, said fixing appliance including two substrate mounting means for mounting to said two substrates, a body portion for holding said substrate at a predetermined spacing from said stationary member, and an elastic pressing portion disposed between said two substrate mounting means for elastically pressing said end faces of the substrates in directions away from each other, wherein said body portion is plate-like and substrate mounting means of different heights are erected on said body portion.

6. A fixing appliance as set forth in claim 5 wherein said elastic pressing portion is contiguous with a support arm projecting sideways from one said substrate mounting means.

7. A fixing appliance as set forth in claim 6, wherein said elastic pressing portion comprises an upper elastic member and downwardly extending lower elastic member, said upper elastic member extending upward and then being bent downward at an intermediate point.

8. A fixing appliance as set forth in claim 7, wherein said upper and lower elastic members are each provided with a substrate retaining portion.

9. A fixing appliance as set forth in claim 5, wherein a chassis mounting mechanism of a structure similar to that of said fixing mechanisms is provided on the lower surface of said body portion.

10. A fixing appliance as set forth in claim 5, wherein said substrate mounting means comprise two support rods erected on said body portion and cylindrical retaining projections formed on free ends of said support rods.

* * * * *